United States Patent
Cho et al.

(10) Patent No.: US 9,450,548 B2
(45) Date of Patent: Sep. 20, 2016

(54) METHOD AND APPARATUS FOR OUTPUTTING AUDIO SIGNAL

(75) Inventors: Jae-yong Cho, Bucheon-si (KR); Hae-kwang Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 649 days.

(21) Appl. No.: 13/420,195

(22) Filed: Mar. 14, 2012

(65) Prior Publication Data

US 2012/0237060 A1 Sep. 20, 2012

Related U.S. Application Data

(60) Provisional application No. 61/452,245, filed on Mar. 14, 2011.

(30) Foreign Application Priority Data

Jul. 7, 2011 (KR) .................. 10-2011-0067538

(51) Int. Cl.
*H03F 99/00* (2009.01)
*H03F 3/217* (2006.01)

(52) U.S. Cl.
CPC ...................... *H03F 3/217* (2013.01)

(58) Field of Classification Search
CPC .......... H03F 1/301; H03F 1/303; H03F 3/38; H03F 3/217; H03F 3/2171; H03F 3/2173; H04R 5/04
USPC ....... 381/28, 85, 102, 108, 120; 330/10, 251
See application file for complete search history.

(56) References Cited

U.S. PATENT DOCUMENTS

| 6,700,518 B2 | 3/2004 | Kishida |
| 7,746,935 B2 | 6/2010 | Bonfiglio |
| 2002/0096674 A1* | 7/2002 | Cho et al. ................. 257/22 |
| 2003/0038674 A1 | 2/2003 | Masuda et al. |
| 2006/0133002 A1 | 6/2006 | Kanoh et al. |
| 2007/0146067 A1* | 6/2007 | Kishida ..................... 330/10 |

(Continued)

FOREIGN PATENT DOCUMENTS

| JP | 2000-59153 A | 2/2000 |
| JP | 2003-258576 A | 9/2003 |

(Continued)

OTHER PUBLICATIONS

Eric, 2006, Audio Dialogue, p. 5.*

*Primary Examiner* — Vivian Chin
*Assistant Examiner* — William A Jerez Lora
(74) *Attorney, Agent, or Firm* — Sughrue Mion, PLLC

(57) ABSTRACT

An apparatus for outputting audio signals. The apparatus for outputting audio signals includes a pulse density modulation (PDM) unit for PDM modulating an input audio signal to output a modulated audio signal, a driving signal generator for generating at least one driving signal to control switching amplification operations based on the modulated audio signal, and a power switching amplifier having at least one switch that is turned on or turned off in response to the driving signal and performs the switching amplification operations for using the at least one switch to output an amplified audio signal that corresponds to the modulated audio signal, wherein the at least one switch includes at least one from among a gallium nitride (GaN) transistor, gallium arsenide (GaAs) transistor, and a silicon carbide (SiC) transistor.

14 Claims, 7 Drawing Sheets

(56) References Cited

U.S. PATENT DOCUMENTS

| | | | | |
|---|---|---|---|---|
| 2007/0279127 A1* | 12/2007 | Lee | .................. | H03F 3/2173 330/10 |
| 2008/0284508 A1* | 11/2008 | Walker | .................. | H03F 3/217 330/10 |
| 2010/0013554 A1* | 1/2010 | Park | .................. | H03F 3/2173 330/10 |
| 2010/0019847 A1* | 1/2010 | Stanley | .................. | H03F 1/32 330/251 |
| 2011/0025397 A1* | 2/2011 | Wang | .................. | H03K 19/018521 327/333 |
| 2011/0090008 A1* | 4/2011 | Kunihiro | .................. | H03F 1/0211 330/131 |

FOREIGN PATENT DOCUMENTS

| | | |
|---|---|---|
| JP | 2004-179945 A | 6/2004 |
| JP | 2004-229215 A | 8/2004 |

\* cited by examiner

METHOD AND APPARATUS FOR OUTPUTTING AUDIO SIGNAL

CROSS-REFERENCE TO RELATED PATENT APPLICATION

This application claims priority from U.S. Provisional Application No. 61/452,245, filed on Mar. 14, 2011, in the United States Patent and Trademark Office and Korean Patent Application No. 10-2011-0067538, filed on Jul. 7, 2011, in the Korean Intellectual Property Office, the disclosures of which are incorporated herein in their entirety by reference.

BACKGROUND

1. Field

The exemplary embodiments relate to a method and an apparatus for outputting audio signals, and more particularly, to an apparatus for outputting audio signals quickly. The exemplary embodiments also relate to a method and an apparatus for outputting audio signals which quickly amplify an audio signal into a higher voltage signal. Further, the exemplary embodiments relate to a method and an apparatus for outputting audio signals which prevent degradation of the sound quality of the audio signals.

2. Description of the Related Art

An audio device may employ a class A, B, AB, or D power amplifiers for receiving an audio signal and outputting it as an acoustically recognizable signal. Among them, the class D amplifier has been widely used because it reduces the degradation of amplification efficiency which occurs in the class A, B, or AB amplifiers.

The class D amplifier is a digital amplifier that converts an audio signal from an analog form to a digital form, amplifies and outputs the digital audio signal.

The digital amplifier is widely used because it has little loss in data conversion and may achieve 100 percent of amplification efficiency in theory. For an apparatus which outputs audio signals using this digital amplifier, it is important to output an input audio signal at maximum amplification without signal distortion.

Accordingly, there is a need to provide a method and an apparatus for outputting audio signals that minimize degradation of audio quality by reducing noise and minimizing signal distortion.

SUMMARY

The exemplary embodiments provide a method and an apparatus for outputting audio signals that may reduce errors and noise that may occur in switching amplification by performing fast switching amplification operations.

The exemplary embodiments also provide a method and an apparatus for outputting audio signals that may minimize degradation of audio quality by increasing signal-to-noise ratio.

According to an aspect of the exemplary embodiments, there is provided an apparatus for outputting audio signals, the apparatus comprising, a pulse density modulation (PDM) unit which PDM modulates an input audio signal to output a modulated audio signal; a driving signal generator which generates at least one driving signal to control switching amplification operations based on the modulated audio signal; and a power switching amplifier comprising at least one switch that is turned on or turned off in response to the at least one driving signal and performs the switching amplification operations which output an amplified audio signal that corresponds to the modulated audio signal, wherein the at least one switch comprises at least one of a gallium nitride (GaN) transistor, a gallium arsenide (GaAs) transistor, and a silicon carbide (SiC) transistor.

The PDM unit may filter at least one of switching noise components and power noise components in the input audio signal having an original audio signal, and PDM unit modulates the filtered input audio signal and outputs the modulated audio signal.

The PDM unit may comprise a delta-sigma modulation (DSM) unit which DSM modulates the input audio signal to output the modulated audio signal.

The apparatus may further comprise a feedback loop which outputs a feedback signal generated by attenuating and delaying the amplified audio signal to the PDM unit.

The PDM unit may comprise a delta-sigma modulation (DSM) unit which generates the input audio signal by compensating for at least one from among a delay of an original audio signal and a gain of the original audio signal, and which filters at least one from among the switching noise components and power noise components in the input audio signal.

The DSM unit may comprise an adder which subtracts the feedback signal from the original audio signal; a loop filter which receives an output signal from the adder and pushes a noise component in the output signal from the adder; and a quantization unit which quantizes an output signal from the loop filter to generate the modified audio signal.

The feedback loop may comprise an attenuation unit which applies a predetermined subtractive gain value to attenuate the amplified audio signal; and a delay unit which delays an output signal from the attenuation unit by a predetermined period of time or phase at a sampling cycle of the PDM unit to output the feedback signal.

The PDM unit may comprise a high-order 1-bit single-loop DSM unit which shapes at least one of switching noise components and power noise components included in the input audio signal and outputs a 1-bit output signal.

The driving signal generator may generate the at least one driving signal to drive the switch to output a high power voltage or a low power voltage.

The driving signal generator may generate a first driving signal to output the high power voltage and a second driving signal to output the low power voltage.

The switching amplifier may comprise a first switch that turns on or off in response to the first driving signal the first switch comprising a first terminal being connected to the high power voltage and a second terminal outputting the amplified audio signal; and a second switch which turns on or off in response to the second driving signal, the second switch comprising a first terminal being connected to the low power voltage and a second terminal outputting the amplified audio signal.

The driving signal generator may further comprise a first transformation unit which boosts the first driving signal to be output; and a second transformation unit which boosts the second driving signal to be output.

The at least one GaN transistor may comprise a heterojunction field effect transistor (HFET).

The apparatus may further comprise a low pass filter which converts the amplified audio signal to an analog signal; and a speaker unit which transforms the analog signal into a physical oscillating signal as an output.

According to another aspect of the exemplary embodiments, there is provided a method of outputting audio signals, the method comprising pulse density modulation (PDM) modulating an input audio signal to output a modulated audio signal; generating at least one driving signal to control switching amplification operations based on the modulated audio signal; and outputting an amplified audio signal that corresponds to the modulated audio signal by turning on or turning off at least one switch using at least one driving signal, wherein the at least one switch comprises at least one of a gallium nitride (GaN) transistor, a gallium arsenide (GaAs) transistor, and a silicon carbide (SiC) transistor.

The method may further comprise generating a feedback signal generated by attenuating and delaying the amplified audio signal; and generating the input audio signal by compensating for at least one of a delay and gain of an original audio signal, based on the feedback signal.

The outputting a modulated audio signal may comprise filtering at least one of switching noise components and power noise components in the input audio signal to generate a filtered input audio signal; and quantizing the filtered input audio signal to generate the modulated audio signal.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF THE EXEMPLARY EMBODIMENTS

In implementing a class-D amplifier, a switching amplifier included in the class-D amplifier amplifies a digital audio signal to a signal having a higher voltage level. The switching amplifier is also referred to as a power switching amplifier. The switching amplifier performs switching amplification operations to turn on or turn off a switch according to an input digital signal, and outputs an audio signal at a high voltage level.

In performing the switching amplification operations, switching noise may occur. Also, in supplying high-level or low-level voltage power, power noise may occur. The switching and power noises reduce a signal-to-noise ratio (SNR) of the switching amplifier. The reduction in the SNR, in turn, causes the sound quality of audio signals output from the class-D amplifier to degrade.

In order to increase the SNR of the switching amplifier, the switching amplifier needs to be driven at high speed.

As described below, a method and an apparatus for outputting audio signals to increase an SNR and to drive a switching amplifier at high speed, in accordance with the exemplary embodiments, is described in detail with reference to accompanying drawings.

Figure 1A:
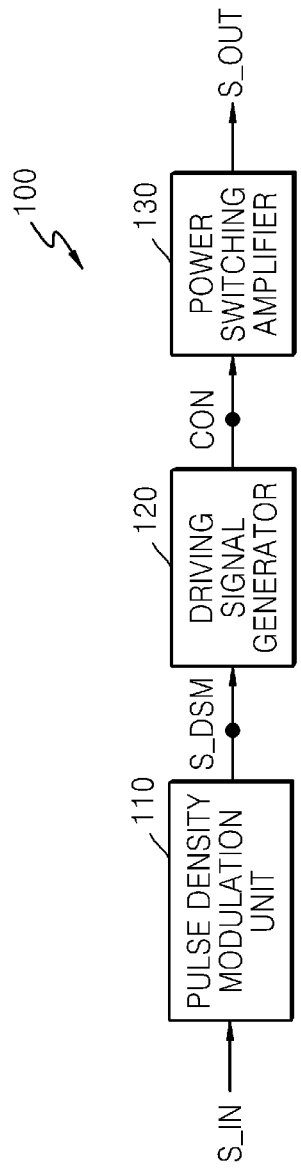
FIGS. 1A and 1B are block diagrams of an apparatus for outputting audio signals, according to the exemplary embodiments
Figure 1B:
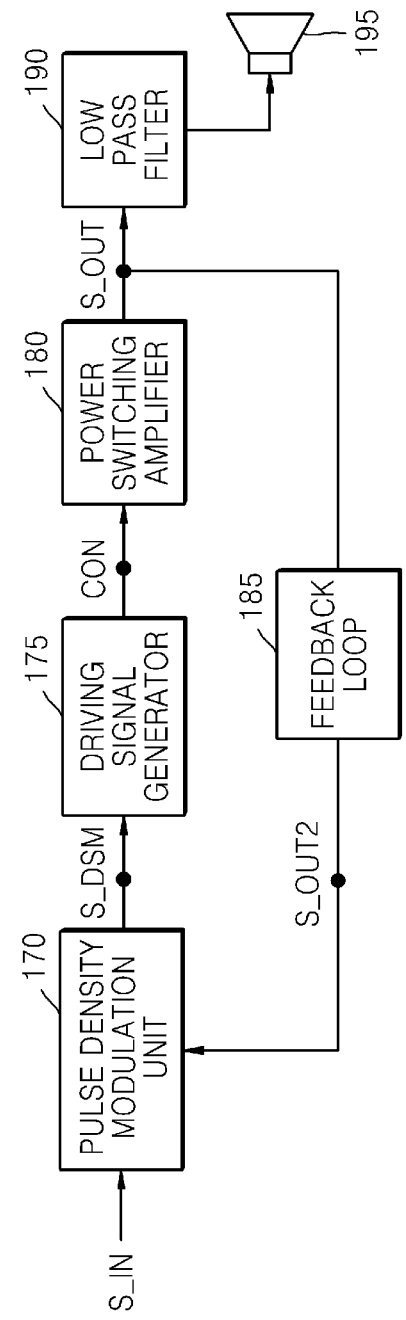

FIGS. 1A and 1B are block diagrams of an apparatus for outputting audio signals, according to an aspect of the exemplary embodiments. FIG. 1A is a block diagram of an apparatus 100 for outputting audio signals, according to an aspect of the exemplary embodiments. FIG. 1B is a detailed block diagram of the apparatus 100, according to another aspect of the exemplary embodiments.

Referring to FIG. 1A, the apparatus 100 includes a pulse density modulation (PDM) unit 110, a driving signal generator 120, and a power switching amplifier 130.

The PDM unit 110 performs pulse density modulation on an input audio signal S_IN to output a modulated audio signal S_DSM.

The input audio signal(not shown) corresponds to an original audio signal S_IN targeted to be output. The input audio signal may be the original audio signal S_IN itself, or a signal having noise. Alternatively, the input audio signal may be a signal resulting from adjusting the original audio signal S_IN to compensate for an overall gain and delay of the apparatus 100, considering an output of the power switching amplifier 130.

In a case that the input audio signal has switching noise and power noise components, the PDM unit 110 may filter at least one of the switching noise and power noise components from the input audio signal, then may pulse-density modulate the filtered input audio signal, and may output a resulting signal S_DSM. The switching noise and power noise components may originate from noise that is created by a switching amplifier during switching amplification operations and noise in a power source, respectively. Filtering operations performed by the PDM unit 110 are described in detail below with reference to FIG. 2.

The driving signal generator 120 generates at least one driving signal CON to drive the power switching amplifier 130 according to the modulated audio signal S_DSM.

Specifically, the driving signal generator 120 generates a switching control signal as the driving signal CON to control the switching amplification operations performed by the power switching amplifier 130. In other words, the power switching amplifier 130 uses the driving signal CON to turn on or turn off at least one switch device (not shown) included in the power switching amplifier 130 to perform the switching amplification operations.

The power switching amplifier 130 includes the at least one switch device (not shown) that is turned on or turned off in response to the driving signal CON output from the driving signal generator 120. The switch device is used to generate an amplified audio signal corresponding to the modulated audio signal S_DSM. Hereinafter, the signal output from the power switching amplifier 130 is referred to as an amplified audio signal S_OUT.

The amplified audio signal S_OUT may result from amplifying the amplitude of the modulated audio signal S_DSM. For instance, the power switching amplifier 130 may amplify the modulated audio signal S_DSM such that the input audio signal S_IN corresponding to the original audio signal input to the apparatus 100 will be output at a maximum rated output of the apparatus 100.

The switch device (not shown) contained in the power switching amplifier 130 includes at least one of gallium nitride (GaN), gallium arsenide (GaAs), and silicon carbide (SiC) transistors.

The GaN and GaAs transistors have short propagation delays and operate fast at a high voltage level. A propagation delay refers to a period of time or phase from when a control signal is input to a gate of a transistor to turn on the transistor to when a saturated voltage signal is output from an output of the transistor, i.e., a source or drain of the transistor.

In the case of using the GaN and GaAs transistors as the switch for performing switching amplification operations in the power switching amplifier 130, fast switching can be performed. The fast switching leads to minimizing of switching noise and thus results in increasing an SNR. In addition, with these transistors, the modified audio signal S_DSM may be amplified and output at a high speed and at a high voltage, which enhances the maximum output of the apparatus 100.

The GaN transistors may be hetero-junction field effect transistors (HFETs).

Referring to FIG. 1B, an apparatus 160 may further include a feedback loop 185 in addition to the components of the apparatus 100 shown in FIG. 1A. The apparatus 160 may also include a low pass filter (LPF) 190 and a speaker 195. A PDM unit 170, a driving signal generator 175, and a power switching amplifier 180 of FIG. 1B correspond to the PDM unit 110, the driving signal generator 125, and the power switching amplifier 130 of FIG. 1A, respectively. Accordingly, detailed descriptions thereof are omitted.

The feedback loop 185 outputs a feedback signal S_OUT2 by attenuating and delaying the amplified audio signal S_OUT.

The PDM unit 170 generates input audio signal by compensating for at least one of a delay and a gain of the original audio signal S_IN based on the feed back signal S_OUT2. And, the PDM unit 170 filters at least one of switching noise and power noise components in the input audio signal and pulse-density modulates the filtered input audio signal.

The LPF 190 outputs an analog audio signal by demodulating the amplified audio signal S_OUT output from the power switching amplifier 180. That is, the LPF 190 converts the digital signal output from the power switching amplifier 180 to an analog audio signal.

The speaker 195 converts the analog signal output from the LPF 190 to a physical vibrating signal audibly recognizable by the user as an output.

Figure 2:
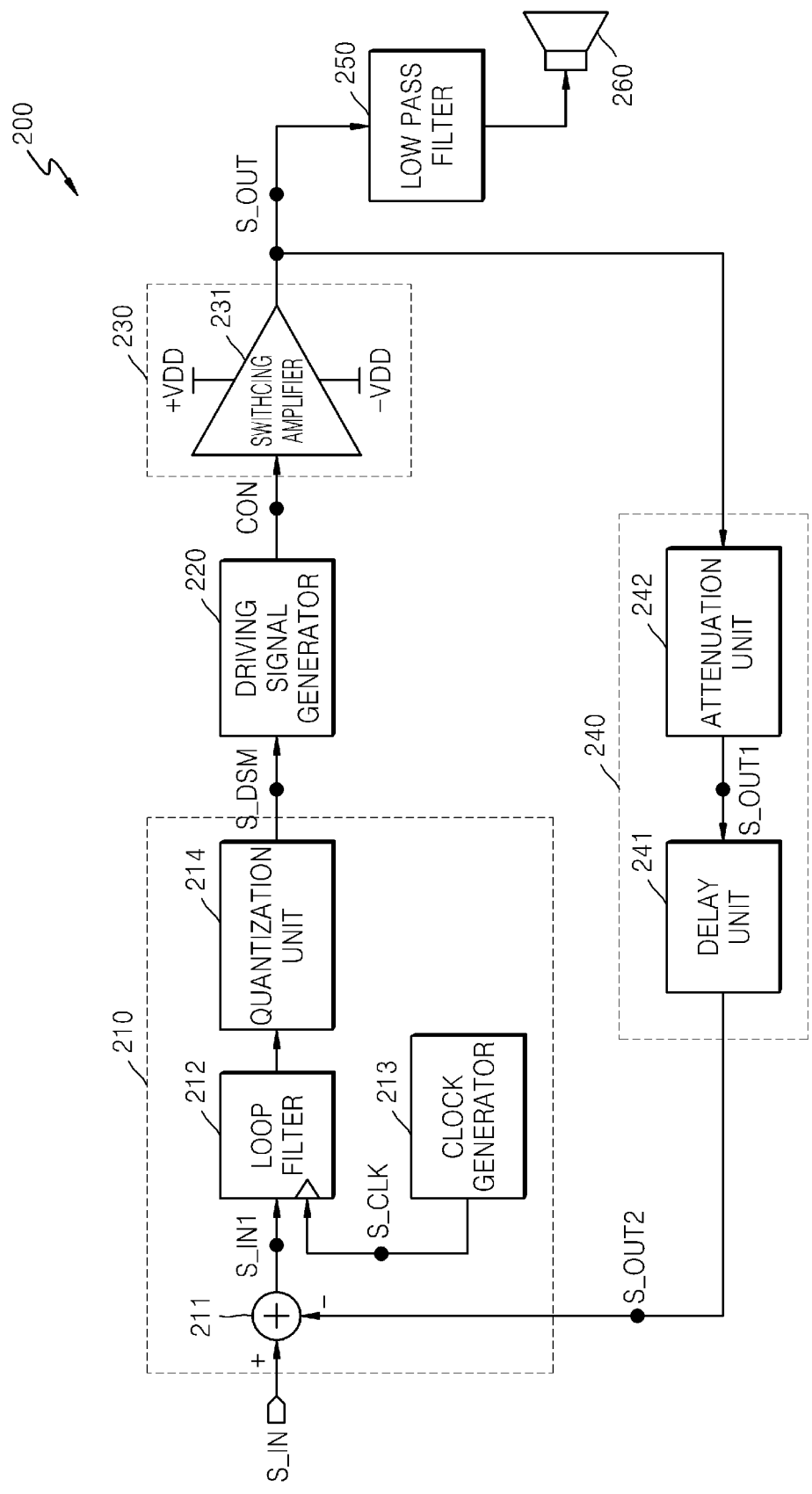
FIG. 2 is a block diagram of an apparatus for outputting audio signals, according to another aspect of the exemplary embodiments.

FIG. 2 is a block diagram of an apparatus 200 for outputting audio signals, according to another aspect of the exemplary embodiments.

In FIG. 2, a PDM unit 210, a driving signal generator 220, and a power switching amplifier 230 of the apparatus 200 correspond to the PDM unit 110, the driving signal generator 125, and the power switching amplifier 130 of FIG. 1A, respectively. Also, the PDM unit 210, the driving signal generator 220, the power switching amplifier 230, a feedback loop 240, a LPF 250, and a speaker 260 correspond to the PDM unit 170, the driving signal generator 175, the power switching amplifier 180, the feedback loop 185, the LPF 190, and the speaker 195, respectively. Accordingly, detailed descriptions thereof are omitted.

Referring to FIG. 2, the PDM unit 210 may include a delta-sigma modulator (DSM) unit for delta-sigma modulating an input audio signal to output a modulated audio signal S_DSM. In FIG. 2, by way of example, the case in which the PDM unit 210 includes a DSM unit is illustrated. Hereinafter, the PDM unit 210 is referred to as the DSM unit 210.

The DSM unit 210 receives an original audio signal S_IN, delta-sigma modulates an input audio signal S_IN1 corresponding to the original audio signal S_IN, and outputs a modulated audio signal S_DSM. Specifically, the DSM unit 210 may filter switching noise and power noise components in the original audio signal S_IN and then delta-sigma modulates the filtered input audio signal S_IN1. Specifically, a sigma-delta modulator performs shaping on a noise component included in an input audio signal S_IN1 by pushing it to an outband of a frequency band.

Specifically, the DSM unit 210 may delta-sigma modulate the input audio signal S_IN1 resulting from adding or subtracting a predetermined value to or from the original audio signal S_IN reflecting an amplified audio signal S_OUT. When performing delta-sigma modulation on the input audio signal S_IN 1 resulting from adjusting the original audio signal S_IN reflecting the amplified audio signal S_OUT, the DSM unit 210 may control an output and overall gain of the apparatus 200 more accurately.

Referring to FIG. 2, the DSM unit 210 includes an adder 211, a loop filter 212, and a quantization unit 214. The DSM unit 210 further includes a clock generator 213.

Specifically, the DSM unit 210 may include a high-order 1-bit single-loop DSM unit for generating the output signal in a single bit. FIG. 2 illustrates a scenario in which DSM unit 210 is high-order 1-bit single-loop DSM unit that receives a feedback signal S_OUT2 output from the feedback loop 240 and the original audio signal S_IN, and then outputs a quantized 1-bit output signal S_DSM.

The adder 211 receives the feedback signal S_OUT2 and the original audio signal S_IN, and then outputs the adjusted input audio signal S_IN1 by subtracting the feedback signal S_OUT2 from the original audio signal S_IN. By using the adder 211 to generate the input audio signal S_IN1 by feeding back the amplified audio signal S_OUT onto the original audio signal S_IN, the DSM unit 210 may perform a proper gain control to meet a target gain or maximum rated output.

The loop filter 212 filters noise components in the adjusted input audio signal S_IN1.

The feedback signal S_OUT2 is generated by attenuating and delaying the amplified audio signal S_OUT. Thus, the feedback signal S_OUT2 may contain quantization noise, power noise, and switching noise included in the amplified audio signal S_OUT.

The quantization noise originates from a quantization error that occurs when the quantization unit 214 quantizes an input signal. The power noise is noise in the power (+VDD, −VDD) applied when the power switching amplifier 230 performs switching amplification operations, and may include, for example, alternate current components, such as, jitter and ripples, in addition to a direct current voltage value of the power (+VDD, −VDD). The switching noise is noise that occurs when the switching amplifier 230 performs switching in the process of the switching amplification operations.

Furthermore, the adjusted input audio signal S_IN1 contains all of the foregoing quantization, power, and switching noises, because the input audio signal S_IN1 results from subtracting the feedback signal S_OUT2 output from the feedback loop 240 from the original audio signal S_IN.

Thus, the loop filter 212 filters the noise components discussed above from the adjusted input audio signal S_IN1. For example, the loop filter 212 pushes the noise components to an outband of a audible frequency band.

The clock generator 213 generates a clock signal S_CLK for establishing a sampling period of the loop filter 213.

Generally, because the input audio signal S_IN1 target to be output comprises low frequency components and noise comprises high frequency components, the loop filter 212 may filter out certain frequency components out of a certain frequency band. The certain frequency band is a target frequency range over which the original audio signal S_IN is. For example, as the target output, a music or voice signal has a relatively low frequency band compared with a noise signal. Therefore, the loop filter 212 may include a LPF for filtering out high frequency components higher than a predetermined frequency value in order to eliminate a noise signal.

The quantization unit 214 receives and quantizes a signal output from the loop filter 212 into a modulated audio signal S_DSM in a digital form.

The driving signal generator 220 receives the modulated audio signal S_DSM and generates at least one driving signal CON to control switching amplification operations based on the modulated audio signal S_DSM. The switching amplification operations are performed in the power switching amplifier 230 using at least one switch device (not shown). The driving signal CON is a switching control signal to control turn on or turn off of the switch device included in the power switching amplifier 230.

The power switching amplifier 230 comprises a switching amplifier 231 having the at least one switch device(not shown). The switching amplifier 231 is supplied high power voltage +VDD and low power voltage −VDD as a bias voltage, and outputs a voltage signal with the high power voltage +VDD level and the low power voltage −VDD level in response to the driving signal CON. The switching voltage and the switching amplifier 231 will be described in more detail below with reference to FIGS. 4 and 5.

An attenuation unit 242 generates an attenuated audio signal S_OUT1 by applying a predetermined subtractive gain value to attenuate the amplified audio signal S_OUT. Specifically, as the amplified audio signal S_OUT output from the power switching unit 230 is at high voltage level, if the amplified audio signal S_OUT enters the DSM unit 210 as it is, abnormal oscillation may occur due to the input high voltage level. Therefore, in order to prevent the abnormal oscillation, the attenuation unit 242 forces the voltage level of the amplified audio signal S_OUT to be lowered to the level of the original audio signal S_IN.

A delay unit 241 delays the attenuated audio signal S_OUT1 by a predetermined amount of time or phase at a sampling rate of the DSM unit 210 to generate a feedback signal S_OUT2.

Signals generated in the apparatus 200 of FIG. 2, such as, the clock signal S_CLK, the modulated audio signal S_DSM, the amplified audio signal S_OUT, the attenuated audio signal S_OUT1, and the feedback signal S_OUT2, will be described now in detail with reference to FIG. 3.

Figure 3:
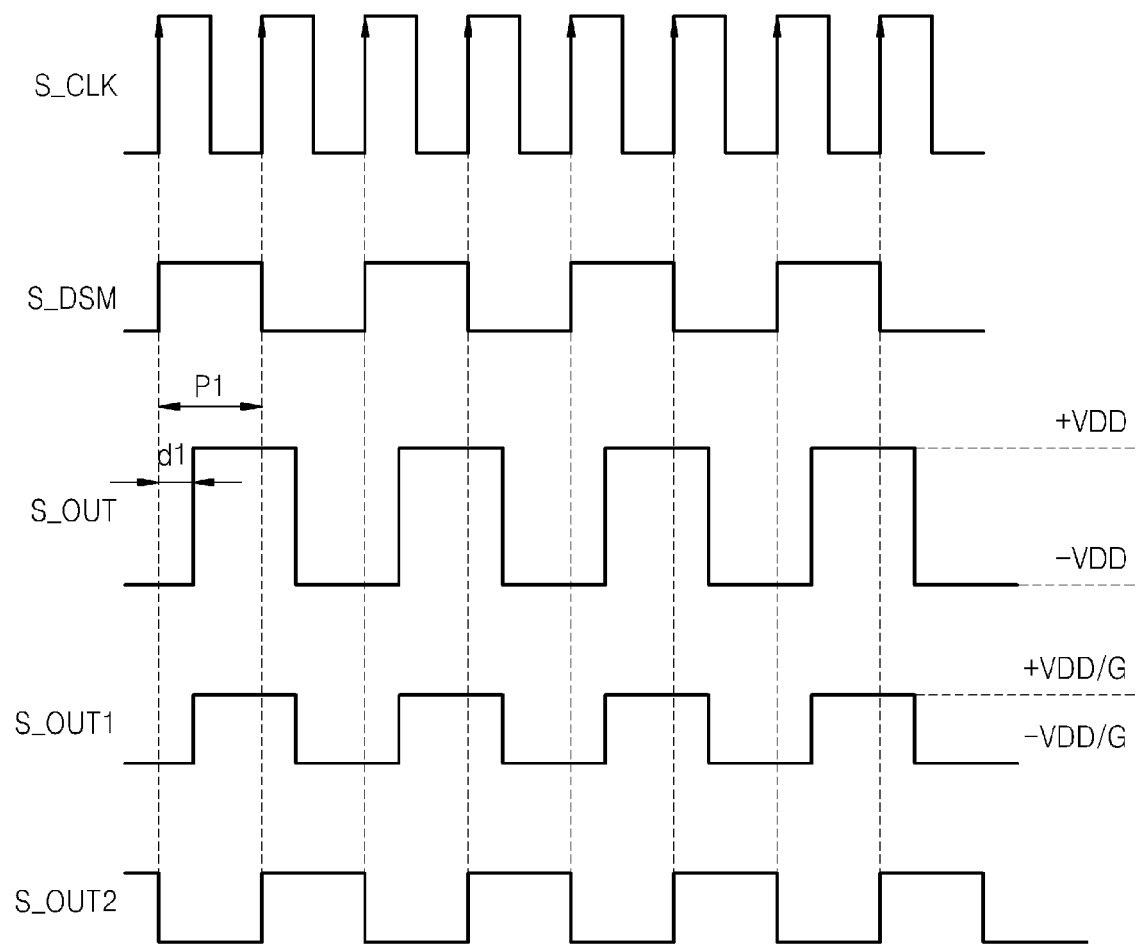
FIG. 3 is a timing diagram of signals generated and output by the apparatus for outputting audio signals of FIG. 2.

FIG. 3 is a timing diagram of the signals generated in the apparatus 200 of FIG. 2.

Referring to FIG. 3, the clock generator 213 generates the clock signal S_CLK having a predetermined cycle.

The DSM unit 210 generates the modulated audio signal S_DSM at the sampling rate according to the clock signal S_CLK.

The modulated audio signal S_DSM becomes a high-voltage amplified audio signal S_OUT having high and low voltage levels +VDD and −VDD by the power switching amplifier 230.

The attenuation unit 242 uses a predetermined subtractive gain G to lower the voltage level of the amplified audio signal S_OUT and output an attenuated audio signal S_OUT1. The signal level of the attenuated audio signal S_OUT1 may correspond to that of the modulated audio signal S_DSM. FIG. 3 illustrates a case in which the signal level of the attenuated audio signal S_OUT1 is derived by dividing the amplified audio signal S_OUT by the predetermined gain value G, i.e., +VDD/G and −VDD/G.

The delay unit 241 delays the attenuated audio signal S_OUT1 at rising edges of the clock signal S_CLK, which is the sampling rate of the DSM unit 210, to generate the feedback signal S_OUT2.

In order to operate the apparatus 200 properly, the power switching amplifier 230 should generate the amplified audio signal S_OUT having a transition in one period P1 of the clock signal S_CLK, which is a sampling period. Accordingly, the amount of delay D1 of the amplified audio signal S_OUT should not exceed the period P1 of the clock signal S_CLK.

However, the higher the logic-high voltage level of the amplified audio signal S_OUT is, the longer a rising time during which there is a transition from the low voltage level −VDD to the high voltage level _VDD.

In the exemplary embodiments, the switching amplifier 231 includes at least one of GaN, GaAs, and SiC transistors to perform fast switching operations, thus minimizing the rising time. It may, in turn, lead to a production of the amplified audio signal S_OUT with a high voltage level and, thus, to an increase in the maximum output of the apparatus 200.

Figure 4A:
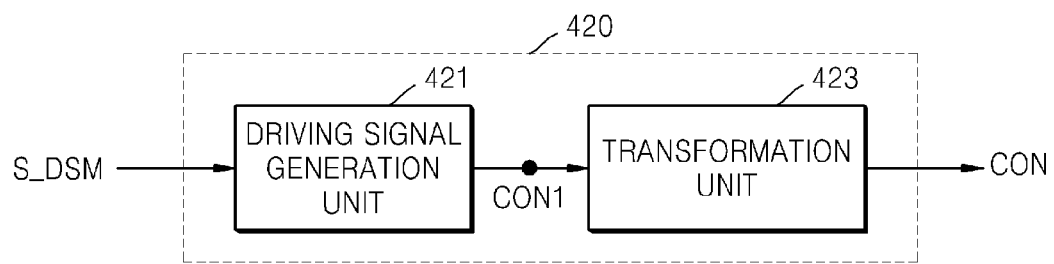
FIGS. 4A and 4B are detailed diagrams of a driving signal generator of FIG. 2.
Figure 4B:
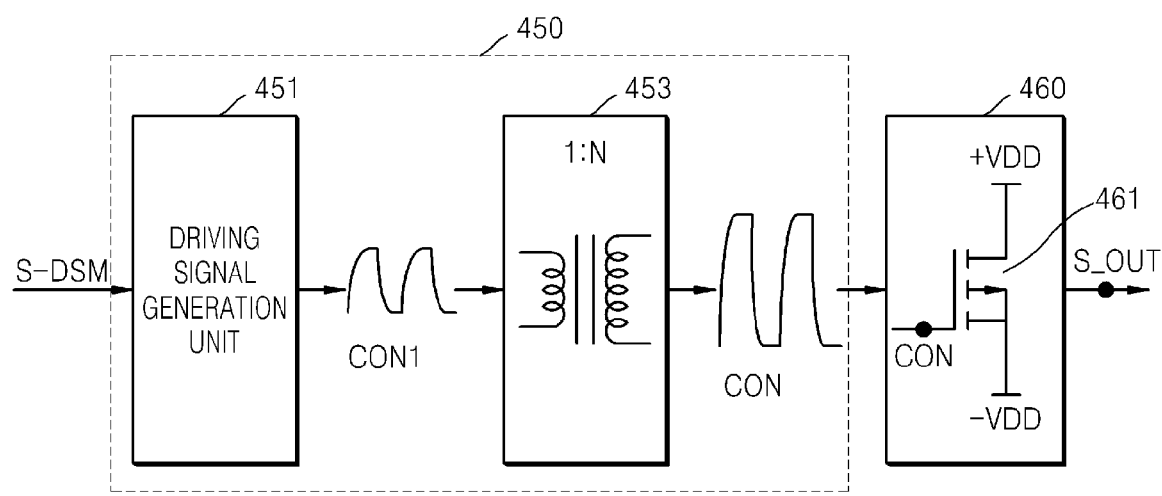

FIGS. 4A and 4B are detailed diagrams of the driving signal generator 120 of FIG. 2. Since a driving signal generator 420 of FIG. 4A corresponds to the driving signal generators 120, 175, and 220 shown in FIGS. 1 and 2, detailed descriptions thereof are omitted. FIG. 4B is also diagram of the driving signal generator 420 with a more detailed explanation.

Referring to FIG. 4A, the driving signal generator 420 may include a driving signal generation unit 421 and a transformation unit 423.

The driving signal generation unit 421 generates at least one first driving signal CON1 for at least one switch included in the switching amplifier 231 to drive high or low power voltages +VDD or −VDD.

The transformation unit 423 outputs the driving signal CON by boosting the first driving signal CON1. The boosted up driving signal CON may make the switch turn on faster.

Referring to FIG. 4B, a driving signal generator 450, a driving signal generation unit 451, a transformation unit 453 and a switching amplifier 460 correspond to the driving signal generator 420, the driving signal generation unit 421, the transformation unit 423, and the switching amplifier 231, respectively, so detailed descriptions thereof are omitted. In FIG. 4B, a case in which the switching amplifier 460 comprises a switch 461 is shown, for example.

The driving signal generator 451 outputs a first driving signal CON1 that corresponds to the modulated audio signal S_DSM.

The transformation unit 453 includes a transformer that boosts an input voltage at a ratio of 1:N, and outputs a driving signal CON resulting from N-fold stepping up of the first driving signal CON1.

A gate of the switch 461 receives the driving signal CON, and the switch 461 outputs high or low power voltages +VDD or −VDD according to the signal level of the driving control CON.

Figure 5:
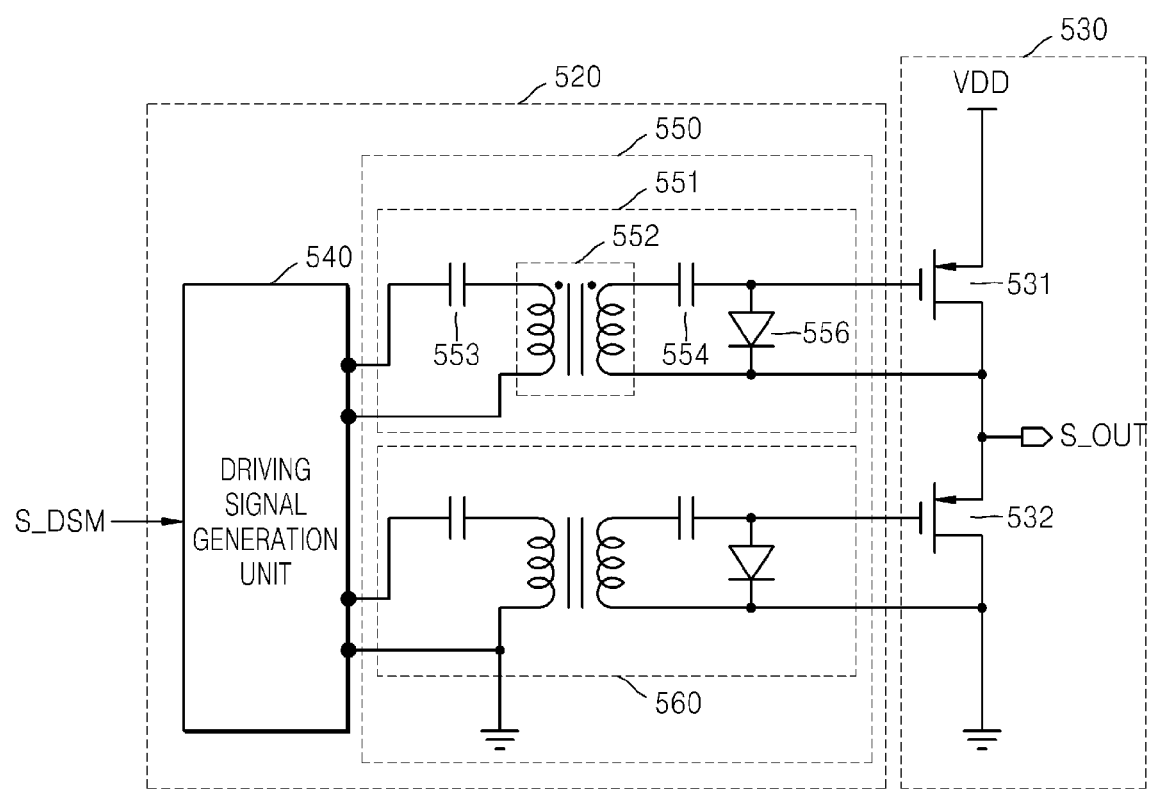
FIG. 5 is a detailed diagram of the driving signal generator of FIG. 2.

FIG. 5 is a detailed diagram of the driving signal generator 175 of FIG. 2, according to another aspect of the exemplary embodiments.

A driving signal generator 520 and a switching amplifier 530 of FIG. 5 correspond to the driving signal generators 220, 420, and 450 and the switching amplifiers 231 and 461, respectively, so detailed descriptions thereof are omitted.

Referring to FIG. 5, the driving signal generator 520 includes a driving signal generator 540 and a transformation unit 550. The transformation unit 550 includes first and second transformation units 551 and 560.

The switching amplifier 530 includes first and second switches 531 and 532 in series.

The driving signal generator 540 receives the modulated audio signal S_DSM to generate first and second driving signals to drive the high and low power voltages +VDD and −VDD. In FIG. 5, a case in which the low power voltage is 0 V, i.e., the ground voltage, is shown. In this case, the first driving signal is output to the first transformation unit 551, and the second driving signal is output to the second transformation unit 560.

A terminal of the first switch 531 is connected to the high power voltage +VDD and the other terminal thereof outputs the amplified audio signal S_OUT. A terminal of the second switch 532 outputs the amplified audio signal S_OUT and the other terminal thereof is connected to the low power voltage, that is, the ground.

The first transformation unit 551 includes a transformer 552 and capacitors 553 and 554, and boosts the first driving signal to be output to a gate of the first switch 531. The first transformation unit 551 also includes a diode 556 for preventing the current from flowing backward.

The first switch 531 may be promptly turned on or turned off in response to the boosted high voltage level first driving signal.

The second transformation unit 560 has the same configuration as the first transformation unit 551, and boosts the second driving signal to be output to a gate of the second switch 532.

The second switch 532 may be promptly turned on or turned off in response to the boosted high voltage level second driving signal.

Figure 6:
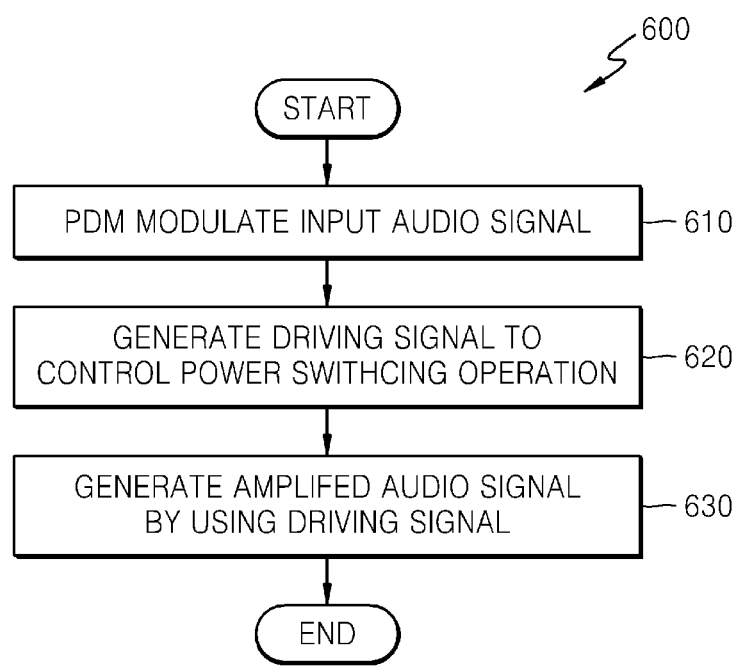
FIG. 6 is a flowchart of a method of outputting audio signals, according to the exemplary embodiments.

FIG. 6 is a flowchart of a method 600 of outputting audio signals, according to an aspect of the exemplary embodiments.

Referring to FIG. 6, the method 600 includes outputting a modulated audio signal S_DSM by pulse-density modulating an input audio signal S_IN1 in operation 610. The PDM unit 110 may perform operation 610 of the method 600.

In operation 620, at least one driving signal CON is generated according to the modulated audio signal S_DSM to control switching amplification operations. The driving signal generator 120 may perform operation 620.

The driving signal CON makes at least one switch including at least one of GaN, GaAs, and SiC transistors turn on or off, and, thus, an amplified audio signal S_OUT corresponding to the modulated audio signal S_DSM is generated, in operation 630.

The method 600 shown in FIG. 6 uses the same configurations and performs the same operations described with reference to FIGS. 1 to 5. Thus, some repeated descriptions are omitted.

Figure 7:
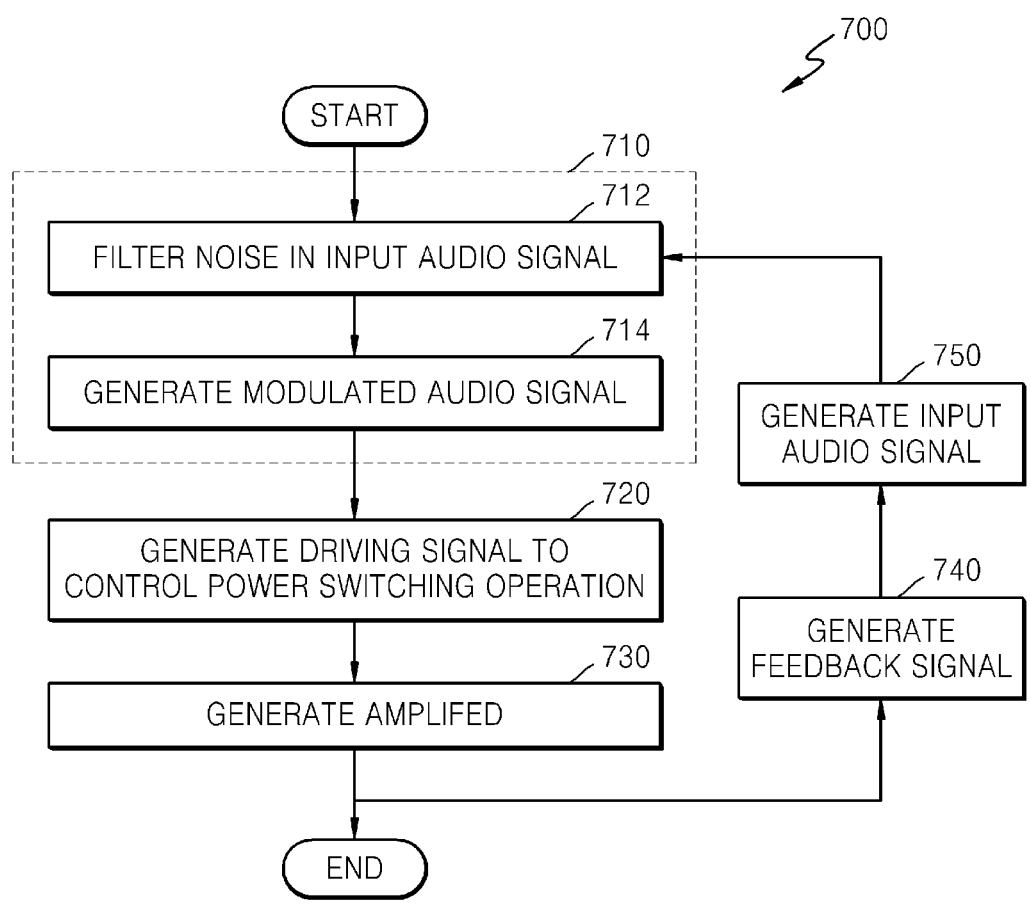
FIG. 7 is a flowchart of a method of outputting audio signals, according to another aspect of the exemplary embodiments.

FIG. 7 is a flowchart of a method 700 of outputting audio signals, according to another aspect of the exemplary embodiments. Operations 710, 720, and 730 of FIG. 7 correspond to operations 610, 620, and 630 of FIG. 6, so detailed descriptions thereof are omitted.

Referring to FIG. 7, the method 700 further includes operations 740 and 750, compared with the method 600.

In operation 740, a feedback signal S_OUT2 is generated by attenuating and delaying the amplified audio signal S_OUT generated in operation 730. The feedback loop may perform operation 740.

Based on the feedback signal S_OUT2 generated in operation 740, an input audio signal S_IN1 is generated by compensating for at least one of the delay and gain of an original input audio signal S_IN in operation 750. The PDM unit 170 may perform operation 750.

At operation 712, filtering of at least one of the switching noise and power noise components from the input audio signal S_IN1 may is performed. The PDM unit 170 may also perform operation 712.

Additionally, the filtered input audio signal is quantized to generate a modulated audio signal S_DSM in operation 714.

The method 700 shown in FIG. 7 uses the same configurations and performs the same operations as the apparatuses 100 and 200 shown in FIGS. 1 to 5. Thus, some repeated descriptions are omitted.

As discussed above, an apparatus and method for outputting audio signals may filter at least one of switching and power noise components in an input audio signal, during pulse-density modulation, to generate a modulated audio signal, thus increasing an SNR. Furthermore, they may use a switching amplifier having at least one of GaN, GaAs, SiC transistors to perform switching amplification operations, thus promptly generating and outputting the amplified audio signal with a high voltage level. Accordingly, the apparatus and method for outputting audio signals, according to the exemplary embodiments achieve a high SNR and fast operation.

The exemplary embodiments can be embodied as computer-readable codes on a computer-readable storage medium. The computer-readable storage medium is any data storage device that can store data which can be thereafter read by a computer system. Examples of the computer-readable storage medium include a magnetic storage medium (e.g., a read-only memory (ROM), floppy disk, hard disk, etc.) and an optical medium (e.g., a compact disc ROM (CD-ROM), digital versatile disc (DVD), etc.).

While the inventive concept has been particularly shown and described with reference to exemplary embodiments thereof, it will be understood by those of ordinary skill in the art that various changes in form and details may be made therein without departing from the spirit and scope of the exemplary embodiments as defined by the following claims.

What is claimed is:

1. An apparatus for outputting audio signals, the apparatus comprising:
   a pulse density modulation (PDM) unit which PDM modulates an input audio signal to output a modulated audio signal;
   a driving signal generator which generates at least one driving signal to control switching amplification operations based on the modulated audio signal, the at least one driving signal comprising a first driving signal and a second driving signal;
   a power switching amplifier comprising at least one switch that is turned on or turned off in response to the at least one driving signal and performs the switching amplification operations which output an amplified audio signal that corresponds to the modulated audio signal; and
   a feedback loop which outputs a feedback signal generated by attenuating a voltage level of the amplified audio signal to be lowered to a level of an original audio signal and delaying the amplified audio signal to the PDM unit, wherein the at least one switch comprises at least one from among a gallium nitride (GaN) transistor, a gallium arsenide (GaAs) transistor, and a silicon carbide (SiC) transistor, wherein the at least one GaN transistor comprises a hetero-junction field effect transistor (HFET), wherein the power switching amplifier generates the amplified audio signal having a transition in a sampling period, wherein the driving signal generator generates the first driving signal to output a high power voltage and the second driving signal to output a low power voltage, and wherein the driving signal generator comprises:
a first transformation unit which boosts the first driving signal to he output; and
a second transformation unit whith boosts the second driving signal to be output.

2. The apparatus of claim 1, wherein the PDM unit modulates the filtered input audio signal and outputs the modulated audio signal.

3. The apparatus of claim 2, wherein the PDM unit comprises a delta-sigma modulation (DSM) unit which DSM modulates the input audio signal to output the modulated audio signal.

4. The apparatus of claim 1, wherein the PDM unit comprises a delta-sigma modulation (DSM) unit which generates the input audio signal by compensating for at least one from among a delay of an original signal and a gain of the original audio signal, and which filters at least one from among the switching noise components and power noise components in the input audio signal.

5. The apparatus of claim 4, wherein the DSM unit comprises,
an adder which subtracts the feedback signal from the original audio signal;
a loop filter which receives an output signal from the adder and pushes a noise component in the output signal from the adder; and
a quantization unit which quantizes an output signal from the loop filter to generate the modified audio signal.

6. The apparatus of claim 1, wherein the feedback loop comprises,
an attenuation unit which applies a predetermined subtractive gain value to attenuate the amplified audio signal; and
a delay unit which delays an output signal from the attenuation unit by a predetermined period of time or phase at a sampling cycle of the PDM unit to output the feedback signal.

7. The apparatus of claim 1, wherein the PDM unit comprises a high-order 1-bit single-loop DSM unit which shapes at least one of switching noise components and power noise components included in the input audio signal and outputs a 1-bit output signal.

8. The apparatus of claim 1, wherein the driving signal generator generates the at least one driving signal to drive the switch to output the high power voltage or the low power voltage.

9. The apparatus of claim 1, wherein the switching amplifier comprises:
a first switch which turns on or off in response to the first driving signal, the first switch comprising a first terminal being connected to the high power voltage and a second terminal outputting the amplified audio signal; and a second switch which turns on or off in response to the second driving signal, the second switch comprising a first terminal being connected to the low power voltage and a second terminal outputting the amplified audio signal.

10. The apparatus of claim 1, further comprising:
a low pass filter which converts the amplified audio signal to an analog signal; and
a speaker unit which transforms the analog signal into a physical oscillating signal as an output.

11. A method of outputting audio signals, the method comprising:
pulse density modulation (PDM) modulating an input audio signal to output a modulated audio signal;
generating at least one driving signal to control switching amplification operations based on the modulated audio signal, the at least one driving signal comprising a first driving signal and a second driving signal;
outputting an amplified audio signal that corresponds to the modulated audio signal by turning on or turning off at least one switch using the at least one driving signal;
generating a feedback signal generated by attenuating a voltage level of the amplified audio signal to be lowered to a level of an original audio signal and delaying the amplified audio signal; and
generating the input audio signal by compensating for at least one of a delay and gain of an original audio signal, based on the feedback signal,
wherein the at least one switch comprises at least one from among a gallium nitride (GaN) transistor, a gallium arsenide (GaAs) transistor, and a silicon carbide (SiC) transistor,
wherein the at least one GaN transistor comprises a hetero-junction field effect transistor (HFET), and
wherein the amplified audio signal has a transition in a sampling period,
wherein the generating at least one driving signal comprises generating the first driving signal to output a high power voltage and the second driving signal to output a low power voltage, and
wherein the generating at least one driving signal comprises, boosting the first driving signal to be output by using a first transformation unit and boosting the second driving signal to be output by using a second transformation unit.

12. The method of claim 11, wherein the outputting a modulated audio signal comprises:
quantizing the filtered input audio signal to generate the modulated audio signal.

13. The method of claim 11, wherein the PDM modulating modulates the input audio signal by compensating for at least one from among a delay and a gain of the original audio signal based on the feedback signal and filters at least one of switching noise components and power noise components included in the input audio signal.

14. The apparatus of claim 1, wherein the PDM unit comprises a delta sigma modulation (DSM) unit which modulates the input audio signal by compensating for at least one from among a delay and a gain of the original audio signal based on the feedback signal and filters at least one of switching noise components and power noise components included in the input audio signal.

* * * * *